(12) United States Patent
Mutsuura et al.

(10) Patent No.: US 11,114,949 B2
(45) Date of Patent: Sep. 7, 2021

(54) INVERTER CONTROL BOARD THAT IS CONFIGURED SO THAT A DETECTION CIRCUIT IS APPROPRIATELY ARRANGED

(71) Applicant: AISIN AW CO., LTD., Anjo (JP)

(72) Inventors: Keita Mutsuura, Miyoshi (JP); Maiko Nitta, Obu (JP)

(73) Assignee: AISIN AW CO., LTD., Anjo (JP)

( * ) Notice: Subject to any disclaimer, the term of this patent is extended or adjusted under 35 U.S.C. 154(b) by 0 days.

(21) Appl. No.: 16/645,670

(22) PCT Filed: Nov. 14, 2018

(86) PCT No.: PCT/JP2018/042082
§ 371 (c)(1),
(2) Date: Mar. 9, 2020

(87) PCT Pub. No.: WO2019/098217
PCT Pub. Date: May 23, 2019

(65) Prior Publication Data
US 2020/0280268 A1    Sep. 3, 2020

(30) Foreign Application Priority Data

Nov. 17, 2017  (JP) .............................. JP2017-222220

(51) Int. Cl.
*H02M 7/00* (2006.01)
*H02M 7/537* (2006.01)
*H02M 1/08* (2006.01)

(52) U.S. Cl.
CPC ............. *H02M 7/537* (2013.01); *H02M 1/08* (2013.01); *H02M 7/003* (2013.01)

(58) Field of Classification Search
CPC ........ H02M 7/537; H02M 7/003; H02M 7/48; H02M 1/08; H02M 3/3374;
(Continued)

(56) References Cited

U.S. PATENT DOCUMENTS

| 2012/0063187 A1 | 3/2012 | Sato et al. | |
| 2012/0286717 A1* | 11/2012 | Fukuta | ..................... B60L 50/61 318/722 |
| 2012/0300521 A1* | 11/2012 | Hida | ..................... H05K 7/1432 363/131 |

FOREIGN PATENT DOCUMENTS

| EP | 2 157 689 A1 | 2/2010 |
| JP | 2016-052198 A | 4/2016 |

(Continued)

OTHER PUBLICATIONS

Jan. 22, 2019 International Search Report issued in International Patent Application No. PCT/JP2018/042082.
(Continued)

*Primary Examiner* — Kyle J Moody
*Assistant Examiner* — Jye-June Lee
(74) *Attorney, Agent, or Firm* — Oliff PLC (57) ABSTRACT

An inverter control board that is configured to be connected to an inverter for performing conversion between direct current power and multiple-phase alternating current power, wherein the inverter has arms, each arm provided for one alternating current phase and comprising a series circuit of a high-side switching element to be connected to a direct-current positive electrode and a low-side switching element to be connected to a direct-current negative electrode.

20 Claims, 8 Drawing Sheets

(58) Field of Classification Search
CPC ........... H02M 2001/0006; H01L 25/18; H01L 25/072; G01R 31/42; G01R 15/04; H03K 2217/0063; H03K 2217/0081; H03K 17/78; H03K 17/691
See application file for complete search history.

(56) References Cited

FOREIGN PATENT DOCUMENTS

| | | |
|---|---|---|
| JP | 2017-42008 A | 2/2017 |
| JP | 2017-60372 A | 3/2017 |

OTHER PUBLICATIONS

Jul. 22, 2020 Search Report issued in European Patent Application No. 18878099.3.

* cited by examiner

INVERTER CONTROL BOARD THAT IS CONFIGURED SO THAT A DETECTION CIRCUIT IS APPROPRIATELY ARRANGED

BACKGROUND

The present disclosure relates to an inverter control board that is configured to be connected to an inverter for performing power conversion between direct current power and multiple-phase alternating current power and where a drive control circuit for driving and controlling the inverter is formed.

Japanese Unexamined Patent Application Publication No. 2017-60372 (JP 2017-60372 A) discloses a power converter (11) that detects a direct current voltage and performs power conversion between direct current power and alternating current power on the basis of the detected voltage (refer to, for example, FIG. 1, FIG. 8, [0016] to [0019], and [0047]). It is noted that reference signs in parentheses in the description of the background art section are the same as those used in the reference document. A direct current voltage supplied from a high-voltage battery (12) is greater than or equal to about 100 volts and is much higher than an operating voltage (generally, about 3.3 to 5 volts) of a control device (40). For this reason, differential amplifier circuits (20, 30) are provided to convert a direct current voltage to be detected into an allowable input voltage to the control device (40). The direct current voltage is inputted to operational amplifiers (21, 31) of the differential amplifier circuits (20, 30) through multiple resistors that are used to divide the voltage. For example, a direct current voltage to be detected is divided by multiple high-resistance resistors (23) and one low-resistance resistor (24) and is then input to one terminal of the operational amplifier (21) of one differential amplifier circuit (20).

On a circuit board (50c), the multiple high-resistance resistors (23) are arranged outside a region where drive circuits (Dp1 to DP4, Dn1 to Dn4) for driving switching elements (SWp1 to SWp4, SWn1 to SWn4) that structure the power converter (11) are formed. Therefore, there is still room for improvement in reducing the size of the circuit board (50c).

SUMMARY

In view of the above background, it is desired that a detection circuit for detecting a direct-current-side voltage of an inverter that performs conversion between direct current power and alternating current power is appropriately arranged on an inverter control board.

In light of the foregoing, an inverter control board according to one aspect is an inverter control board that is configured to be connected to an inverter for performing conversion between direct current power and multiple-phase alternating current power, wherein the inverter has arms, each arm provided for one alternating current phase and comprising a series circuit of a high-side switching element to be connected to a direct-current positive electrode and a low-side switching element to be connected to a direct-current negative electrode, the inverter control board including: a drive control circuit for driving and controlling the inverter; a low-voltage region and a high-voltage region as regions where a plurality of circuits are arranged, wherein: a circuit of the plurality of circuits arranged in the high-voltage region has a higher operating voltage than a circuit of the plurality of circuits arranged in the low-voltage region, the high-voltage region includes a plurality of high-side high-voltage regions, each configured to be connected to the high-side switching element of a corresponding phase, and the high-voltage region includes a plurality of low-side high-voltage regions, each configured to be connected to the low-side switching element of a corresponding phase; an insulation region that electrically insulates the low-voltage region, each of the high-side high-voltage regions, and each of the low-side high-voltage regions from one another, wherein: the circuit in the low-voltage region and the circuit in each of the high-side high-voltage regions are connected via a high-side connection circuit included in a connection circuit across the insulation region and that transmits a signal in an electrically insulated state, and the circuit in the low-voltage region and the circuit in each of the low-side high-voltage regions are connected via a low-side connection circuit included in the connection circuit and that transmits a signal in an electrically insulated state; and a voltage detection circuit for detecting a direct-current-side voltage of the inverter is arranged between the high-side connection circuit and the low-side connection circuit that are adjacent to each other.

The high-side connection circuits and the low-side connection circuits are arranged across the insulation region to connect the circuit in low-voltage region and the circuits in the high-voltage region. That is, portions of the high-side connection circuits and the low-side connection circuits are arranged in the low-voltage region, and the other portions thereof are arranged in the high-voltage region. Further, the voltage detection circuit is arranged between the high-side connection circuit and the low-side connection circuit that are adjacent to each other. Thus, a portion of the voltage detection circuit is arranged in the low-voltage region, and the other portion thereof is arranged in the high-voltage region. Also in the voltage detection circuit, it may be necessary to insulate a circuit arranged in the low-voltage region from a circuit arranged in the high-voltage region. In such a case, there is no need to set an additional insulation region, because the insulation region across which the connection circuits on both sides of the voltage detection circuit are arranged can be utilized. Thus, although the voltage detection circuit is arranged on the inverter control board, an increase in the size of the inverter control board can be curbed. That is, according to this structure, the detection circuit for detecting the direct-current-side voltage of the inverter that performs conversion between direct current power and alternating current power can be appropriately arranged on the inverter control board.

Other features and advantages of the inverter control board will become clear from the following description of the embodiments in conjunction with the drawings.

DETAILED DESCRIPTION OF EMBODIMENTS

Figure 1:
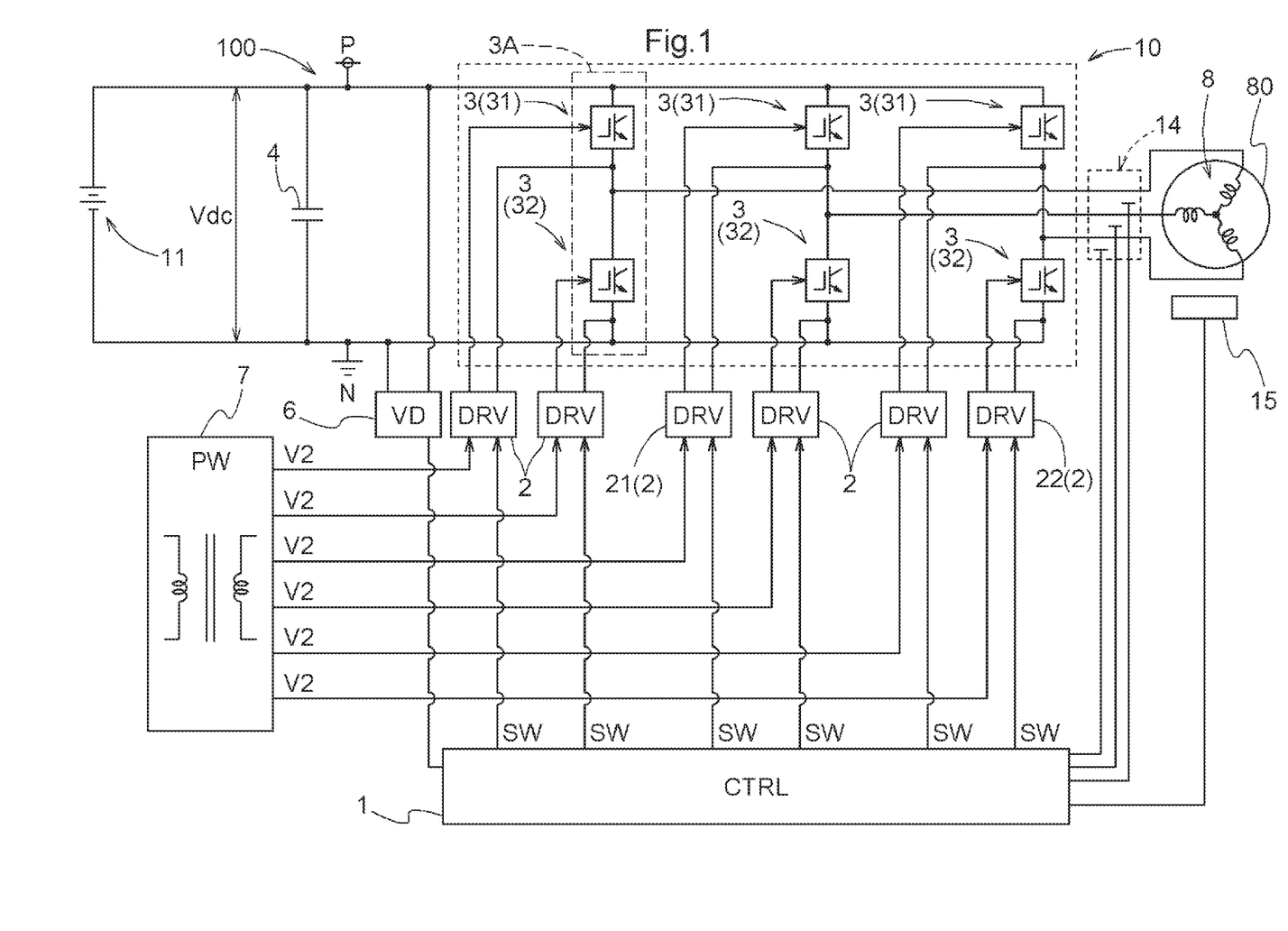
FIG. 1 is a schematic circuit block diagram of a rotating-electric-machine drive device.

An example embodiment where an inverter control board is used in a rotating-electric-machine drive device is described below with reference to the drawings. A circuit block diagram of FIG. 1 schematically illustrates the system structure of a rotating-electric-machine drive device 100. The rotating-electric-machine drive device 100 drives a rotating electric machine 80 via an inverter 10 that is connected to a direct current power supply 11 (a high-voltage direct current power supply) and performs conversion between direct current power and multiple-phase alternating current power. As illustrated in FIG. 1, the inverter 10 includes multiple (three in this example) arms 3A. Each arm 3A is provided for one alternating current phase and is structured with a series circuit of a high-side switching element 31 and a low-side switching element 32. The inverter 10 converts direct current power to multiple-phase (n-phase where n represents a natural number, three in this example) alternating current power and supplies the alternating current power to the rotating electric machine 80. According to the present embodiment, the inverter 10 is structured as a bridge circuit with series circuits (the arms 3A) each of which is provided for a corresponding one of U-phase, V-phase, and W-phase stator coils 8 of the rotating electric machine 80.

The rotating electric machine 80 may function as a generator. When the rotating electric machine 80 function also as a generator, alternating current power generated by the rotating electric machine 80 is converted into direct current power and is then supplied to the direct current power supply 11. The direct current power supply 11 may preferably be structured with, for example, a secondary cell (battery) such as a nickel-metal hydride cell or a lithium-ion cell, or an electric double-layer capacitor.

The rotating electric machine 80 may be, for example, used as a drive power source of a vehicle such as a hybrid vehicle or an electric vehicle. When the rotating electric machine 80 is a drive power source of a vehicle, a direct-current-side voltage of the inverter 10 (a direct current link voltage Vdc) may range, for example, from 200 to 400 volts. The direct current side of the inverter 10 is provided with a smoothing capacitor (a direct current link capacitor 4) for smoothing the direct current link voltage Vdc that fluctuates with fluctuations in power consumption of the rotating electric machine 80.

As illustrated in FIG. 1, the inverter 10 is structured to include multiple switching elements 3. For example, the following power semiconductor elements may preferably be used as the switching elements 3: IGBTs (Insulated Gate Bipolar Transistors); power MOSFETs (Metal Oxide Semiconductor Field Effect Transistors); SiC-MOSFETs (Silicon Carbide Metal Oxide Semiconductor FETs); SiC-SITs (SiC Static Induction Transistors); or GaN-MOSFETs (Gallium Nitride MOSFETs). As illustrated in FIG. 1, according to the present embodiment, IGBTs are used as the switching elements 3. Although not illustrated, each of the switching elements 3 is provided with a freewheeling diode that is connected in parallel with the switching element 3 in a forward direction from a negative electrode to a positive electrode (in a direction from low side to high side).

Figure 3:
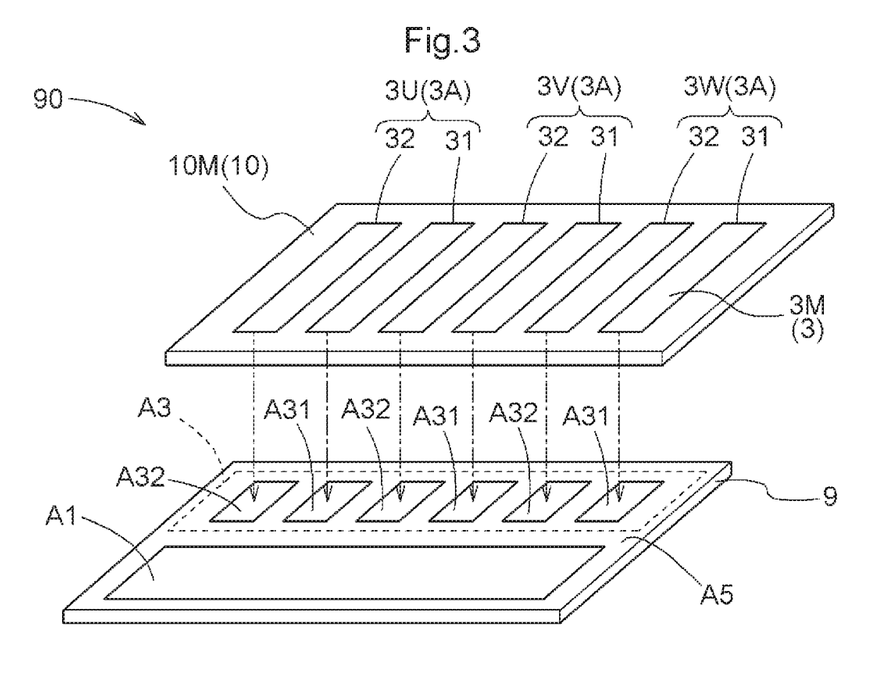
FIG. 3 is a schematic exploded perspective view of an inverter unit.

The switching element 3 may be structured as a switching element module 3M (refer to FIG. 3) that incorporate the freewheeling diode, a temperature sensor for detecting an element temperature, an overcurrent sensor for detecting overcurrent, etc. The switching element module 3M may be structured to include multiple switching elements 3. For example, one arm 3A including two switching elements 3 may be structured as the switching element module 3M, or as illustrated in FIG. 3, the entire inverter 10 including six switching elements 3 may be structured as a switching element module (an inverter module 10M).

The inverter 10 is controlled by an inverter control device (CTRL) 1. The inverter control device 1, corresponding to a switching-element generation circuit that generates switching control signals SW for controlling switching of the switching elements 3 of the inverter 10, is structured with a logical processor as its core member, such as a microcomputer. For example, the inverter control device 1 controls the rotating electric machine 80 via the inverter 10 by performing current feedback control using a vector control method, on the basis of a target torque for the rotating electric machine 80 that is provided from another control device that is not illustrated, such as a vehicle control device. The direct-current-side voltage of the inverter 10 (the direct current link voltage Vdc) is detected by a voltage detection circuit (DC) 6, and the inverter control device 1 obtains the detection result. Actual current through the stator coil 8 of each phase in the rotating electric machine 80 is detected by a current sensor 14, and the inverter control device 1 obtains the detection result. In addition, the magnetic pole position and rotation speed of a rotor of the rotating electric machine 80 at each time point is detected by a rotation sensor 15 such as a resolver, and the inverter control device 1 obtains the detection results.

On the basis of the detection results from the voltage detection circuit 6, the current sensor 14, and the rotation sensor 15, the inverter control device 1 performs current feedback control using, for example, a vector control method. The inverter control device 1 is structured to include various types of functional units for motor control, and the functional units are implemented by cooperation between hardware, such as a microcomputer, and software (a program). Vector control and current feedback control are well known and therefore are not described in detail here.

Figure 2:
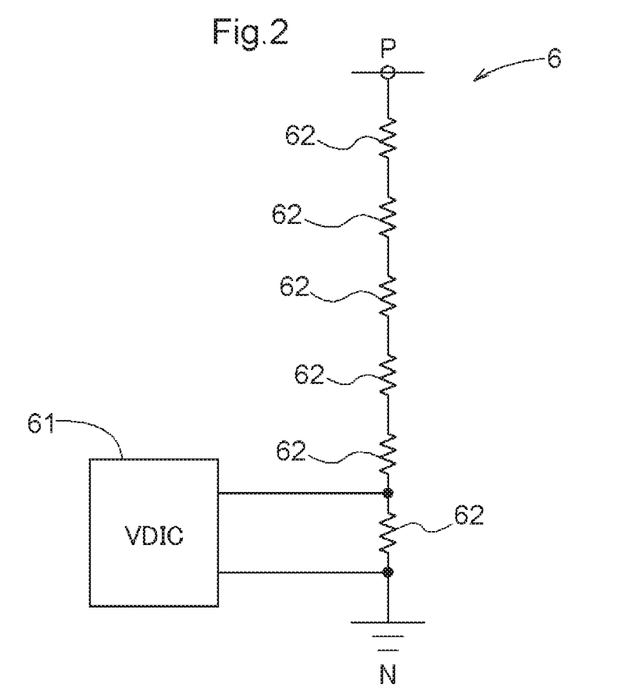
FIG. 2 is a schematic circuit block diagram of a voltage detection circuit.

As illustrated in FIG. 2, the voltage detection circuit 6 is structured with an analog ASSP (Application Specific Standard Product) as its core member, such as a voltage detection IC (DCIC) 61. This type of element generally has an operating voltage of less than 10 volts (less than or equal to about 15 volts). For this reason, as illustrated in FIG. 2, the voltage detection circuit 6 includes multiple resistors (voltage divider resistors 62) connected in series between a direct-current positive electrode P and a direct-current negative electrode N. The voltage divider resistors 62 do not necessarily have the same resistance. The voltage detection IC 61 detects a voltage value that is obtained by dividing the direct current link voltage Vdc of 200 to 400 volts using the resistors (a voltage value divided down to less than the operation voltage of the voltage detection IC 61). Since the voltage divider ratio is known, the inverter control device 1 that has obtained the detection result can calculate a value of the direct current link voltage Vdc on the basis of the detection result and the voltage divider ratio. As described later with reference to FIG. 7, in one preferred aspect, the voltage detection circuit 6 may include multiple resistors (voltage divider resistors 62) that are connected in series between the direct-current positive electrode P and the direct-current negative electrode N so as to divide a voltage, and all the voltage divider resistors 62 may be arranged in a low-side high-voltage region A32.

The inverter control device 1, which generates the switching control signals SW, is an electronic circuit based on a microcomputer or the like and has an operating voltage of 5 volts or 3.3 volts. In many cases, vehicles are equipped with not only the direct current power supply 11, but also a low-voltage direct current power supply (not illustrated) that is a power supply of lower voltage (for example, from 12 volts to 24 volts) than the direct current power supply 11. The inverter control device 1 operates on electric power supplied from a power supply circuit, such as a voltage regulator, that is not illustrated and that generates such an operating voltage on the basis of electric power of the low-voltage direct current power supply. A circuit having a relatively high operating voltage such as the inverter 10 is referred to as a high-voltage circuit, and a circuit having a relatively low operating voltage such as the inverter control device 1 is referred to as a low-voltage circuit.

An exploded perspective view of FIG. 3 schematically illustrates an inverter unit 90 including the inverter 10 and an inverter control board 9. In this example, the inverter 10 is structured as a single inverter module 10M. The inverter control device 1 is formed on the inverter control board 9, and when the inverter control board 9 and the inverter module 10M are electrically connected together, the inverter control device 1 and the inverter 10 are also electrically connected together. As described in detail later, the inverter control board 9 has an insulation region A5 that provides electrical insulation and separation between a low-voltage region A1 and a high-voltage region A3. The low-voltage region A1 is where the inverter control device 1 as the low-voltage circuit is formed. The high-voltage region A3 is connected to the switching elements 3 of the inverter 10 as the high-voltage circuit.

It is noted that there is a large difference in operating voltage between the low-voltage circuit having an operating voltage of 3.3 to 5 volts and the high-voltage circuit having an operating voltage of 200 to 400 volts. For this reason, the rotating-electric-machine drive device 100 includes drive circuits (DRV) 2 that amplifies power of the switching control signals SW (gate drive signals when the switching elements 3 are MOSFETs or IGBTs) for the switching elements 3. In other words, the drive circuits 2 increase the driving capability of the switching control signals SW (the capability to drive subsequent circuits, such as voltage amplitude or output current) and then transmit the switching control signals SW to the respective switching elements 3.

Each of the switching elements 3 is provided with a corresponding one of the drive circuits 2. As illustrated in FIG. 1, according to the present embodiment, the inverter 10 includes six switching elements 3 to be driven, and six respective drive circuits 2 are provided. The drive circuits 2 include high-side drive circuits 21 for transmitting the switching control signals SW to the high-side switching elements 31, and low-side drive circuits 22 for transmitting the switching control signals SW to the low-side switching elements 32. The high-side drive circuits 21 and the low-side drive circuits 22 are referred to simply as the drive circuits 2 unless it is necessary to distinguish between them.

Figure 4:
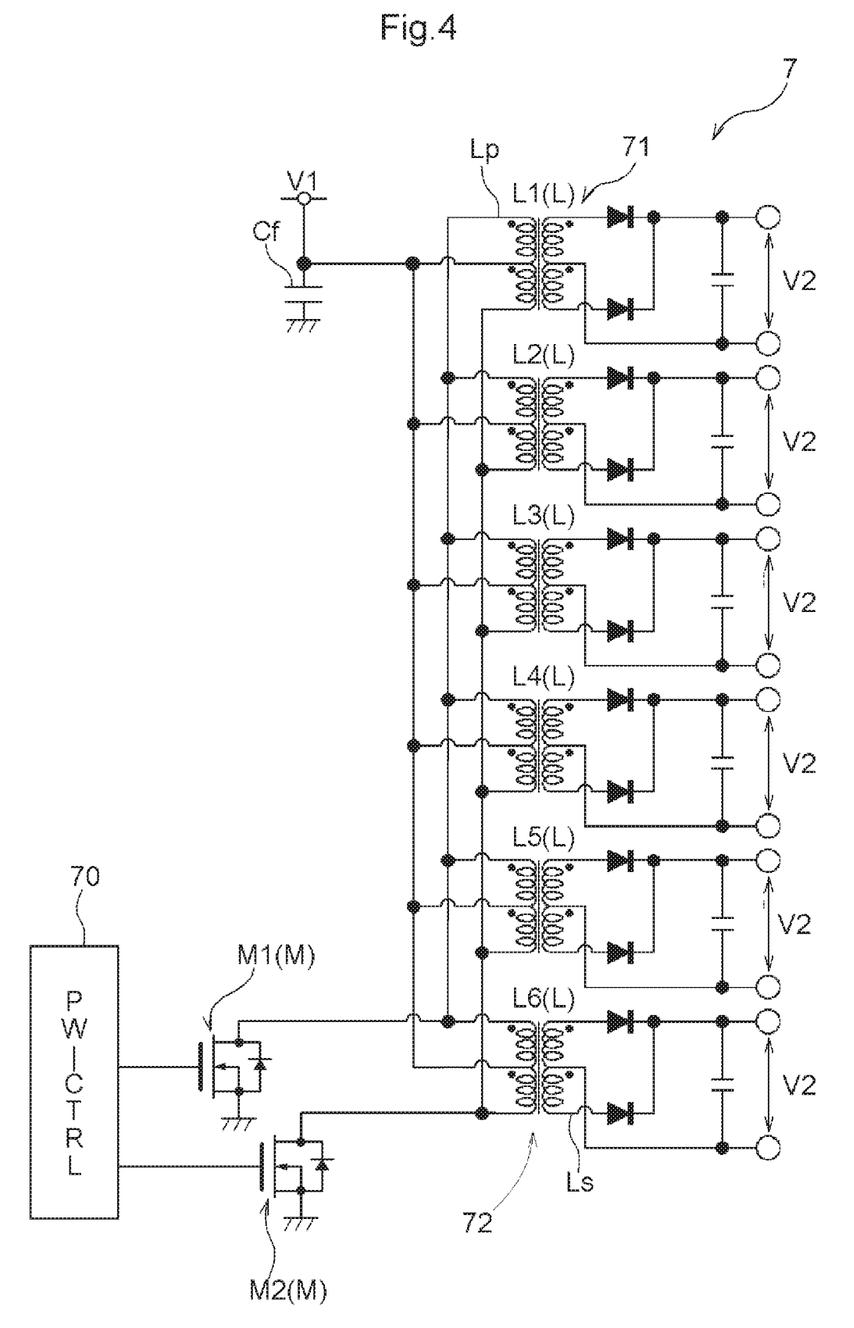
FIG. 4 is a schematic circuit block diagram of a drive power supply circuit.

To drive the switching elements 3 belonging to the high-voltage circuit, the drive circuits 2 need a higher operating voltage than the low-voltage circuit. A drive power supply circuit (PW) 7 is provided to supply power to the drive circuits 2. FIG. 4 illustrates one example of the drive power supply circuit 7. The drive power supply circuit 7 has six transformers L (drive power supplies) corresponding to six switching elements 3 and six drive circuits 2. Specifically, the drive power supply circuit 7 includes three high-side transformers 71 (high-side drive power supplies: a U-phase high-side transformer L2; a V-phase high-side transformer L4; and a W-phase high-side transformer L6) and three low-side transformers 72 (low-side drive power supplies: a U-phase low-side transformer L1; a V-phase low-side transformer L3; and a W-phase low-side transformer L5). Each of the transformers (L1 to L6) has the same structure and outputs a secondary voltage (an output voltage V2) of substantially the same value. A primary voltage (an input voltage V1) common to each of the transformers L is stable, because it is supplied from a power supply circuit, such as a voltage regulator, with a filter capacitor Cf. Thus, the output voltage V2 on the secondary side is not fed back to the primary side, and therefore the output voltage V2 on the secondary side is determined according to the transformation ratio of the transformer L.

Figure 5:
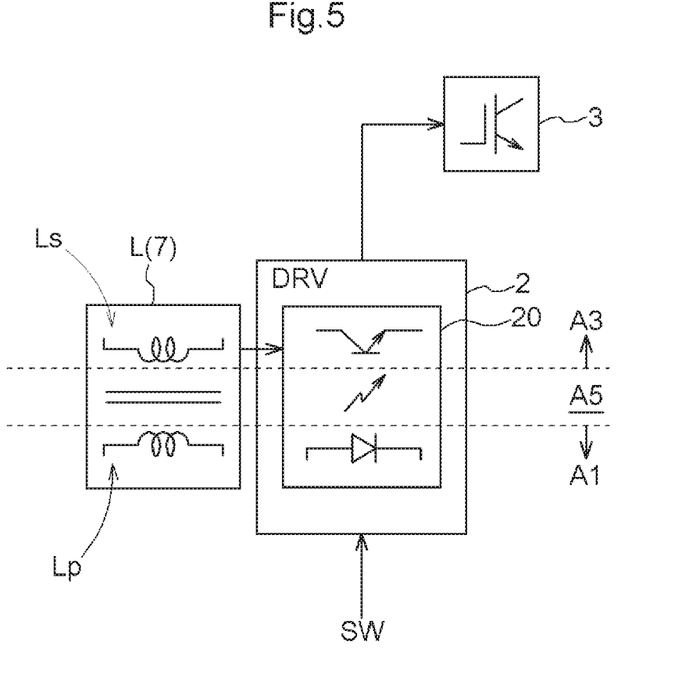
FIG. 5 is a schematic block diagram illustrating an example structure of a drive circuit.

According to the present embodiment, a primary coil Lp of each of the transformers L belongs to the low-voltage circuit, and a secondary coil Ls of each of the transformers L belongs to the high-voltage circuit. That is, as illustrated in FIG. 5, the transformer L is arranged on a border portion between the low-voltage region A1 and the high-voltage region A3, and connects the low-voltage circuit and the high-voltage circuit in an insulated state. As illustrated in FIG. 5, the drive circuit 2 has an insulation element 20 that transmits signals in an electrically insulated state, such as a photocoupler that optically transmits signals or a magnetic coupler that magnetically transmits signals. This insulation element 20 is also arranged on the border portion between the low-voltage region A1 and the high-voltage region A3.

As illustrated in FIG. 2, the primary coil Lp is connected to a transformer-drive switching element M that switches a voltage applied to the primary coil Lp. The example here illustrates a push-pull type switching power supply circuit, and the primary coil Lp is connected to two transformer-drive switching elements M (a first transformer-drive switching element M1 and a second transformer-drive switching element M2) that are controlled to switch in a complementary manner. The switching of the transformer-drive switching elements M is controlled by a power supply control circuit (PW-CTRL) 70.

Alternatively, the drive power supply circuit 7 may be a half-bridge or full-bridge type switching power supply. The type of the drive power supply circuit 7 is not limited to types having multiple transformer-drive switching elements M that are controlled to switch in a complementary manner, such as a push-pull type, a half-bridge type, and a full-bride type. The drive power supply circuit 7 may be a single-forward type or flyback type switching power supply that is controlled by a single transformer-drive switching element M.

As already described, both the drive circuits 2 and the drive power supply circuit 7 are arranged over the low-voltage region A1 and the high-voltage region A3 across the insulation region A5 and therefore can be referred to as connection circuits 5 that transmit signals in an electrically insulated state. The "signals" here are not limited to the switching control signals SW, the detection result from the voltage detection circuit 6, the detection result from the temperature sensor, and the detection result from the overcurrent sensor, but include a power signal that transmits power.

The high-voltage circuit belonging to the high-voltage region A3 includes circuits for the high-side switching elements 31 and circuits for the low-side switching elements 32. That is, the high-voltage region A3 includes high-side high-voltage regions A31 and the low-side high-voltage regions A32 (refer to, for example, FIG. 3 and FIG. 6). The circuits for the high-side switching elements 31, such as portions of the high-side drive circuits 21 and portions of the high-side transformers 71, are arranged in the high-side high-voltage regions A31. The high-side switching elements 31 are connected to the high-side high-voltage regions A31. In contrast, the circuits for the low-side switching elements 32, such as portions of the low-side drive circuits 22 and portions of the low-side transformers 72, are arranged in the low-side high-voltage regions A32. The low-side switching elements 32 are connected to the low-side high-voltage regions A32.

Since the high-voltage region A3 includes the high-side high-voltage regions A31 and the low-side high-voltage regions A32, the connection circuits 5 that transmit signals in an electrically insulated state between the circuits in the low-voltage region A1 and the circuits in the high-voltage region A3 also include high-side connection circuits 51 and low-side connection circuits 52. The high-side connection circuits 51 include the high-side drive circuits 21 and the high-side transformers 71. The low-side connection circuits 52 include the low-side drive circuits 22 and the low-side transformers 72. The circuit in the low-voltage region A1 is connected to the circuits in the high-side high-voltage regions A31 via the high-side connection circuits 51, and the circuit in the low-voltage region A1 is connected to the circuits in the low-side high-voltage regions A32 via the low-side connection circuits 52.

Figure 6:
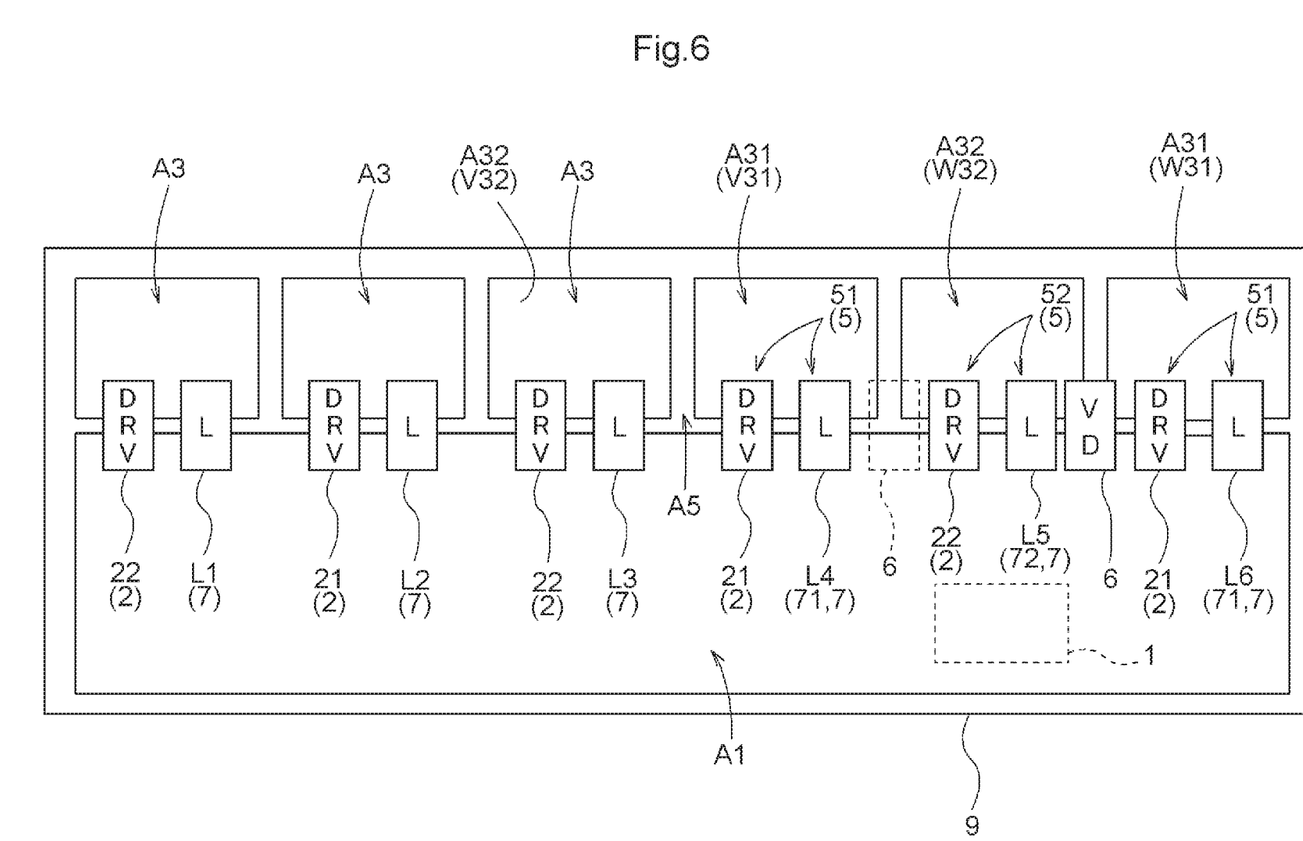
FIG. 6 is a schematic diagram illustrating an example arrangement of the voltage detection circuit on a board.

FIG. 6 illustrates an example arrangement of the voltage detection circuit 6, the transformers L (the drive power supply circuit 7) as drive power supplies, and the drive circuits 2 on the inverter control board 9. It is noted that circuits for driving and controlling the inverter 10, including the inverter control device 1 (a switching-control-signal generation circuit), the voltage detection circuit 6, the drive power supply circuit 7, and the drive circuits 2, are referred to collectively as "drive control circuits". That is, the drive control circuits for driving and controlling the inverter 10 are formed on the inverter control board 9.

The example arrangement illustrated in FIG. 6 is for the case where the switching elements 3 that are arranged in a line as illustrated in FIG. 3 are connected to the inverter control board 9. Accordingly, the high-side high-voltage regions A31 and the low-side high-voltage regions A32 are formed on the board such that they alternate in a line along the direction of arrangement of the switching elements 3. Further, the high-side high-voltage regions A31 and the low-side high-voltage regions A32 are all located adjacent to the low-voltage region A1 across the insulation region A5 in the direction orthogonal to the direction of arrangement of the switching elements 3 (in the direction arrangement of multiple high-voltage regions A3). The high-side connection circuit 51 (the high-side drive circuit 21 and the high-side transformer 71) is arranged between the low-voltage region A1 and each of the high-side high-voltage regions A31. The low-side connection circuit 52 (the low-side drive circuit 22 and the low-side transformer 72) is arranged between the low-voltage region A1 and each of the low-side high-voltage regions A32.

The voltage detection circuit 6 is arranged between the high-side connection circuit 51 and the low-side connection circuit 52 that are adjacent to each other. In the example illustrated in FIG. 6, the voltage detection circuit 6 is arranged between a W-phase high-side high-voltage region W31 (the high-side high-voltage region A31) and a W-phase low-side high-voltage region W32 (the low-side high-voltage region A32). Although the voltage detection circuit 6 is arranged in the W-phase in this example, it is clear that the voltage detection circuit 6 may be arranged in the U-phase or V-phase.

As illustrated in FIG. 6, the connection circuits 5 (the high-side connection circuits 51 and the low-side connection circuits 52 of multiple phases) for the respective switching elements 3 are arranged in a line. The voltage detection circuit 6, which is arranged between the high-side connection circuit 51 and the low-side connection circuit 52 that are adjacent to each other, is arranged therewith in the direction of arrangement of the connection circuits 5. Such a linear arrangement of the voltage detection circuit 6, the drive power supply circuit 7, and the drive circuits 2 allows these circuits to be efficiently arranged on the inverter control board 9.

Figure 7:
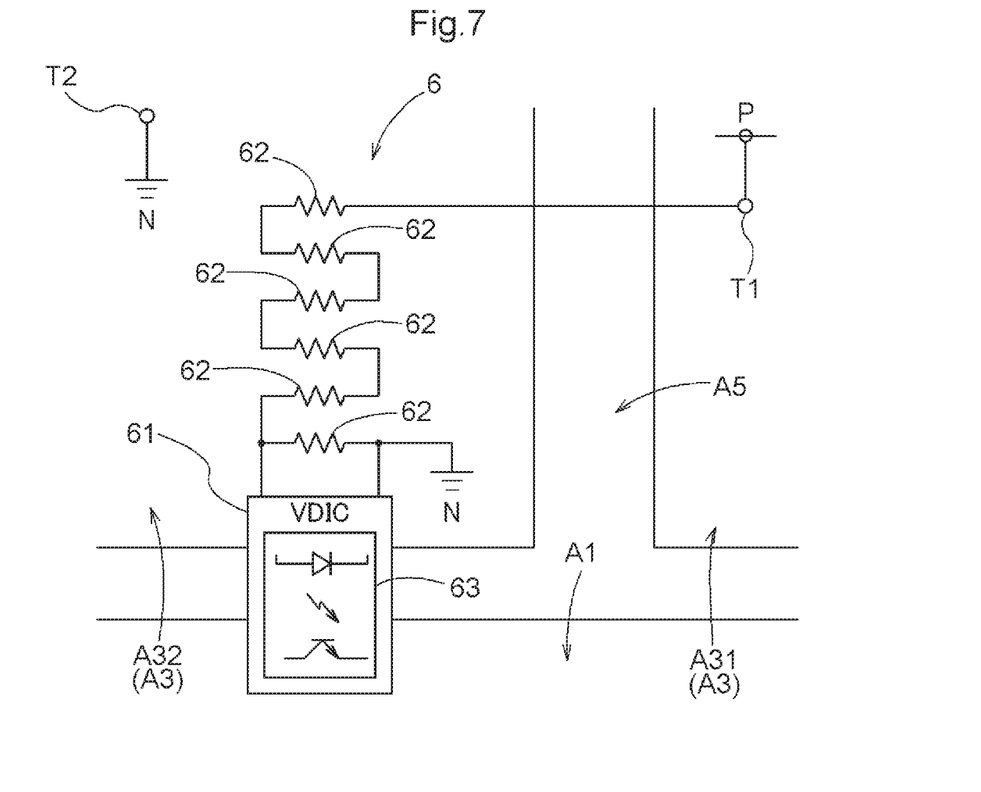
FIG. 7 is a schematic enlarged diagram illustrating the example arrangement of the voltage detection circuit on the board.

As already described with reference to FIG. 2, the voltage detection circuit 6 includes multiple voltage divider resistors 62 that are connected in series between the direct-current positive electrode P and the direct-current negative electrode N. The voltage detection IC 61 detects a voltage value that is obtained by dividing the direct current link voltage Vdc using the resistors. FIG. 7 schematically illustrates a circuit structure of the voltage detection circuit 6 that is arranged over the high-side high-voltage region A31, the low-side high-voltage region A32, and the insulation region A5 (circuitry thereof in the low-voltage region A1 (signal transmission wires and the like) is omitted). The voltage detection circuit 6 is connected to the positive electrode P in the high-side high-voltage region A31 and is connected to the negative electrode N in the low-side high-voltage region A32. A reference potential (ground) for the voltage detection circuit 6 is a reference potential for the low-side high-voltage regions A32 (the negative electrode N). For this reason, in the example illustrated in FIG. 7, the voltage detection IC 61 has an insulation element 63 and is arranged over the low-side high-voltage region A32 and the low-voltage region A1. Although this example illustrates that all the multiple voltage divider resistors 62 are arranged in the low-side high-voltage region A32, this does not prohibit only some of the voltage divider resistors 62 from being arranged in the high-side high-voltage region A31. The detection result from the voltage detection IC 61 is transmitted, via the insulation element 63 incorporated in the voltage detection IC 61, to the inverter control device 1 in the low-voltage region A1.

It is noted that the direct current side of the inverter 10 is commonly connected by a busbar or the like to the direct current power supply 11. When the switching elements 3 are IGBTs, collector terminals of the high-side switching elements 31 are connected to a busbar of the positive electrode P, and emitter terminals of the low-side switching elements 32 are connected to the negative electrode N.

Further, as illustrated in FIG. 1, when the switching elements 3 of the inverter 10 are IGBTs, each of the switching elements 3 is turned on upon application of a specified voltage between its gate terminal (control terminal) and emitter terminal (reference terminal). That is, it is possible to control the switching of the switching elements 3 that employ IGBTs as long as their gate and emitter terminals are connected to the inverter control board 9. In other words, for the switching control, it is unnecessary to connect collector terminals of the switching elements 3 to the inverter control board 9.

Since the negative electrode N is connected to the emitter terminals of the low-side switching elements 32, the negative electrode N is connected to the inverter control board 9 via the emitter terminals of the low-side switching elements 32. In contrast, the positive electrode P is connected to the collector terminals of the high-side switching elements 31 and is therefore not necessarily connected to the inverter control board 9. For this reason, all the high-side high-voltage regions A31 of the inverter control board 9 or at least the high-side high-voltage region A31 where the voltage detection circuit 6 is arranged is provided with a terminal (a positive-electrode-side connection terminal T1) that is connected to the collector terminal of the high-side switching element 31.

Although the above description is based on assumption that the switching elements 3 are IGBTs, the same is true for when the switching elements 3 are bipolar transistors, by replacing gate terminals with base terminals. Similarly, the same is true for when the switching elements 3 are field-effect transistors or the like, by replacing emitter terminals with source terminals and by replacing collector terminals with drain terminals.

In order to arrange the voltage detection circuit 6 on the inverter control board 9, as illustrated in FIG. 7, at least the positive-electrode-side connection terminal T1 that is connected to the collector terminal or drain terminal of the high-side switching element 31 is disposed in the high-side high-voltage region A31. Further, at least a negative-electrode-side connection terminal T2 that is connected to the emitter terminal or source terminal of the low-side switching element 32 is disposed in the low-side high-voltage region A32. Preferably, in each of the high-side high-voltage regions A31, the positive-electrode-side connection terminal T1 may be arranged closer to one of the low-side high-voltage regions A32 that are adjacent to the high-side high-voltage region A31 across the insulation region A5. Likewise, in each of the low-side high-voltage regions A32, the negative-electrode-side connection terminal T2 may be arranged closer to one of the high-side high-voltage regions A31 that are adjacent to the low-side high-voltage region A32 across the insulation region A5. The voltage detection circuit 6 is connected to the positive-electrode-side connection terminal T1 and the negative-electrode-side connection terminal T2 that are adjacent to each other across the insulation region A5.

Incidentally, in the example illustrated in FIG. 6, the voltage detection circuit 6 is arranged between the W-phase high-side high-voltage region W31 (the high-side high-voltage region A31) and the W-phase low-side high-voltage region W32 (the low-side high-voltage region A32). That is, in the example illustrated in FIG. 6, the voltage detection circuit 6 is arranged between the high-side connection circuit 51 and the low-side connection circuit 52 that belong to the same one of multiple phases. As illustrated in FIG. 1, the high-side switching element 31 and the low-side switching element 32 that belong to the same phase are commonly arranged close to each other, because they structure one of the arms 3A of the inverter 10. Therefore, the high-side switching element 31 and the low-side switching element 32 that belong to the same phase are arranged close to each other on the inverter control board 9 to which the switching elements 3 are connected. Naturally, the high-side high-voltage region A31 and the low-side high-voltage region A32 corresponding to the respective switching elements 3 are arranged close to each other. Thus, the voltage detection circuit 6, which is arranged between the high-side high-voltage region A31 and the low-side high-voltage region A32, is also efficiently arranged on the inverter control board 9.

Alternatively, when the switching elements 3 of all the phases that structure the inverter 10 are linearly arranged in a line at almost regular intervals such that the high-side switching elements 31 alternate with the low-side switching elements 32 along the arrangement direction as illustrated in FIG. 3, the voltage detection circuit 6 may be arranged between the high-side connection circuit 51 and the low-side connection circuit 52 that belong to different phases. As indicated by a dashed line in FIG. 6, the voltage detection circuit 6 may be arranged between a V-phase high-side high-voltage region V31 (the high-side high-voltage region A31) and the W-phase low-side high-voltage region W32 (the low-side high-voltage region A32).

It is noted that the arrangement direction that is linear is not necessarily required to arrange the voltage detection circuit 6 between the high-side connection circuit 51 and the low-side connection circuit 52 that belong to different phases. For example, such arrangement of the voltage detection circuit 6 is possible also when the switching elements 3 of all the phases that structure the inverter 10 are arranged in a circle at almost regular intervals.

Figure 8:
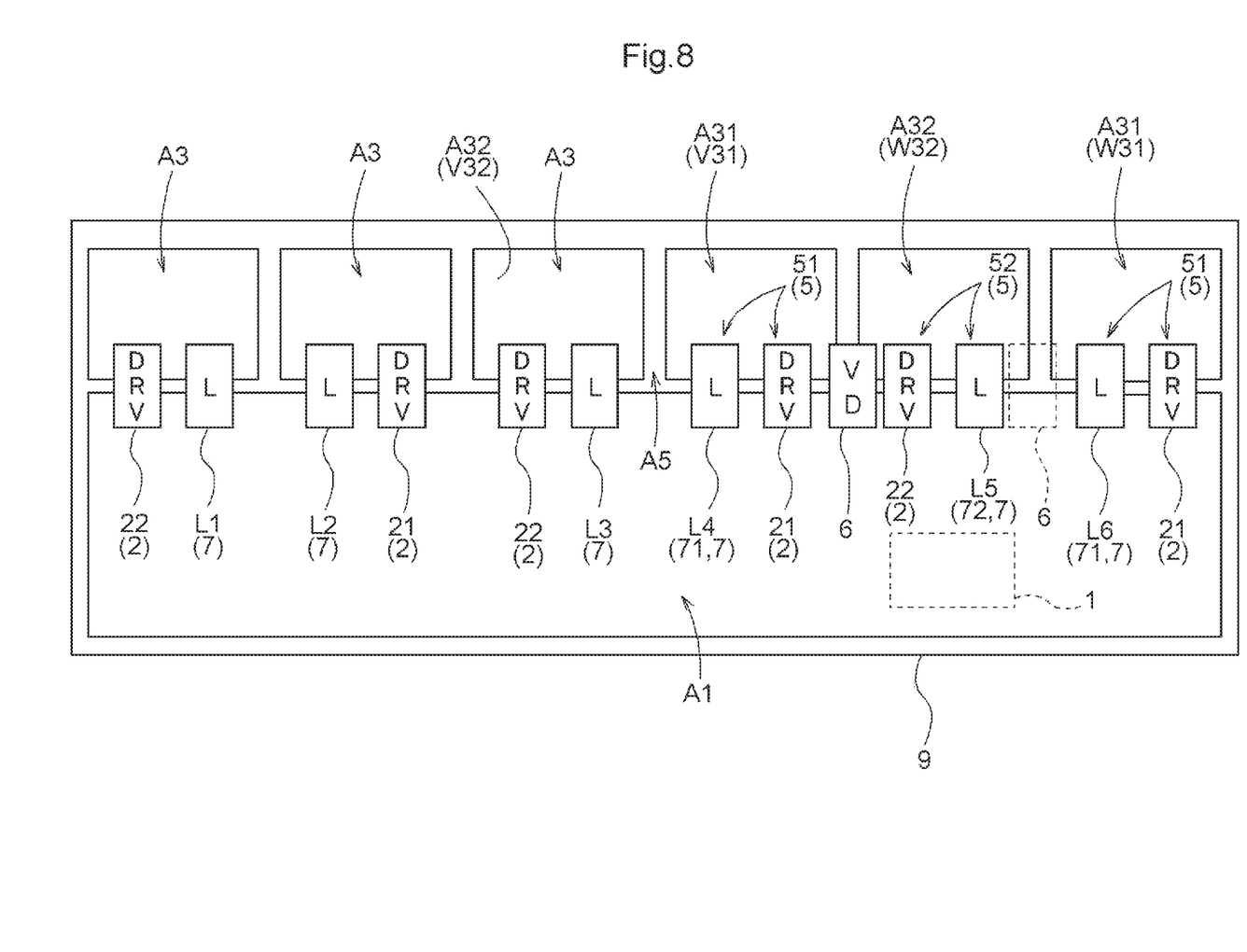
FIG. 8 is a schematic diagram illustrating another example arrangement of the voltage detection circuit on the board.

In the example illustrated in FIG. 6, the drive circuits 2 and the transformers L (drive power supplies) that structure the connection circuits 5 are arranged in the same order along the arrangement direction. That is, in the example illustrated in FIG. 6, the low-side connection circuit 52 and the high-side connection circuit 51 that belong to the same phase are arranged in the following order: the low-side drive circuit 22, the low-side transformer 72, the high-side drive circuit 21, and the high-side transformer 71. Alternatively, as illustrated in FIG. 8, the drive circuits 2 and the transformers L (drive power supplies) may be arranged symmetrically with respect to a line between the high-side connection circuit 51 and the low-side connection circuit 52 that belong to the same phase. That is, the low-side connection circuit 52 and the high-side connection circuit 51 that belong to the same phase may be arranged in the following order: the low-side drive circuit 22, the low-side transformer 72, the high-side transformer 71, and the high-side drive circuit 21.

As already described with reference to FIG. 4, the high-side transformers 71 and the low-side transformers 72 share the primary-side circuit. This allows the high-side transformers 71 and the low-side transformers 72 to be arranged close to each other so as to curb an increase in the wire length of the primary-side circuit, thus making it possible to improve mounting efficiency of the inverter control board 9.

The example illustrated in FIG. 8, where the voltage detection circuit 6 is arranged between the V-phase high-side drive circuit 21 and the W-phase low-side drive circuit 22, takes into account that outputs of the drive circuits 2 are connected to the switching elements 3 and that the voltage detection circuit 6 is structured as described with reference to FIG. 7. That is, in the example illustrated in FIG. 8, the voltage detection circuit 6 is arranged between the high-side connection circuit 51 and the low-side connection circuit 52 that belong to different phases. However, this does not prohibit the voltage detection circuit 6 from being arranged, as indicated by a dashed line in FIG. 8, between the high-side connection circuit 51 and the low-side connection circuit 52 that belong to the same phase.

Incidentally, the inverter control device 1 generates the switching control signals SW on the basis of the detection result from the voltage detection circuit 6 (the direct current link voltage Vdc), the detection result from the current sensor 14 (alternating current value), and the detection result from the rotation sensor 15 (the magnetic pole position and rotation speed of the rotating electric machine 80). If the detection result from the voltage detection circuit 6 is influenced by noise or the like, the switching control signals SW are influenced accordingly. For this reason, a transmission path, including wires on the board, for transmitting the detection result from the voltage detection circuit 6 to the inverter control device 1 preferably have a short length. When the voltage detection circuit 6 is arranged close to the inverter control device 1, the transmission path can be shortened.

As illustrated in, for example, FIG. 3, FIG. 6, and FIG. 8, when the switching elements 3 of all the phases that structure the inverter 10 are linearly arranged in a line at almost regular intervals such that the high-side switching elements 31 alternate with the low-side switching elements 32 along the arrangement direction, there are multiple locations corresponding to portions between the high-side connection circuits 51 and the low-side connection circuits 52. It is preferable that, of the multiple locations between the high-side connection circuits 51 and the low-side connection circuits 52, the voltage detection circuit 6 be arranged at the location closest to the inverter control device 1, as in the examples illustrated in FIG. 6 and FIG. 8. However, this does not prohibit the voltage detection circuit 6 from being arranged regardless of the distance to the inverter control device 1. In particular, when the noise influence described above is slight, the arrangement of other circuits may be prioritized.

Figure 9:
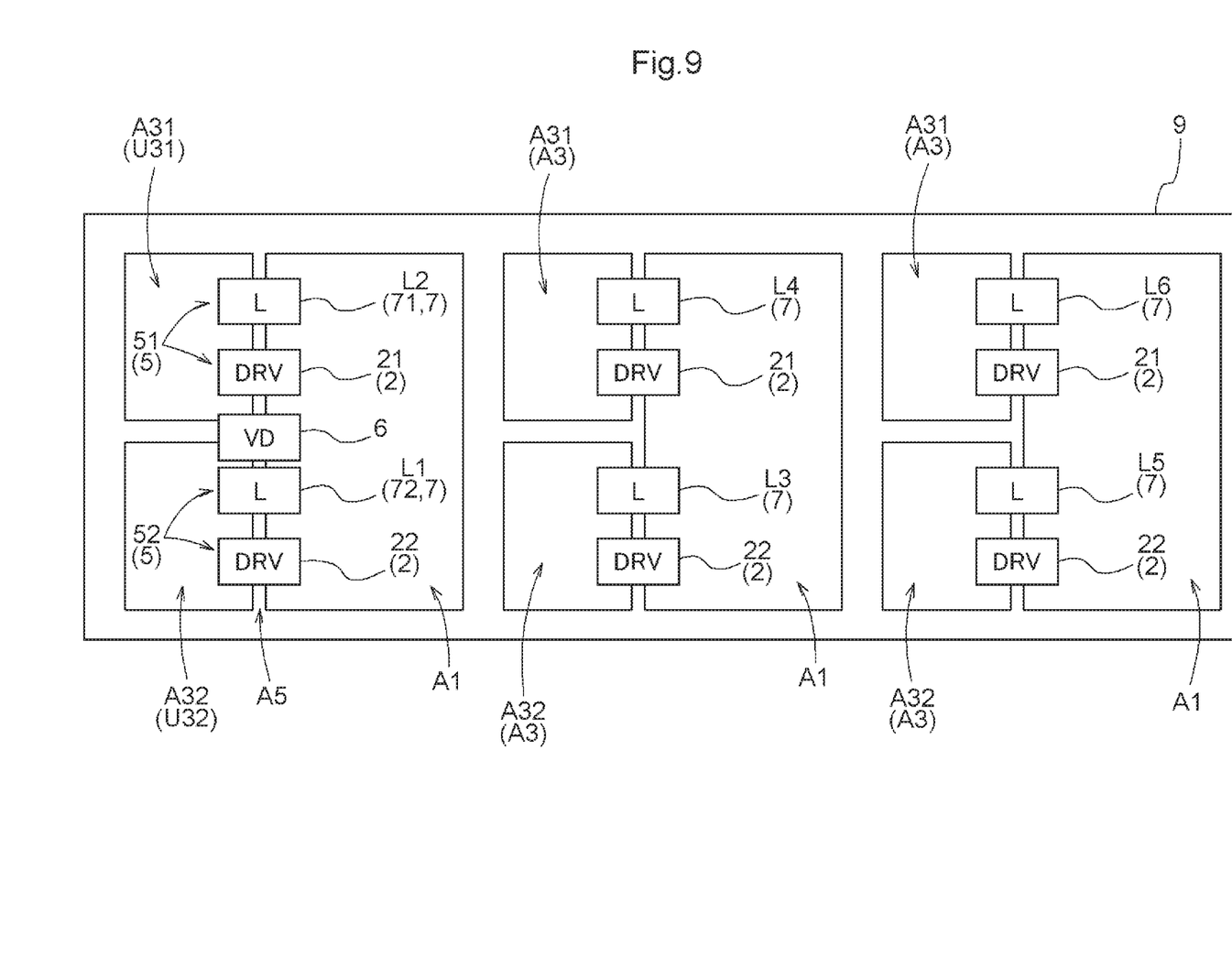
FIG. 9 is a schematic diagram illustrating another example arrangement of the voltage detection circuit on the board.

In the examples described above, as illustrated in, for example, FIG. 3, FIG. 6 and FIG. 8, the switching elements 3 of all the phases that structure the inverter 10 are linearly arranged in a line at almost regular intervals. Alternatively, for example, as illustrated in FIG. 9, only each two switching elements 3 that structure one arm 3A may be arranged adjacent to each other. Also in this case, as illustrated in FIG. 9, it is possible to arrange the voltage detection circuit 6 between the high-side connection circuit 51 (a U-phase high-side high-voltage region U31) and the low-side connection circuit 52 (a U-phase low-side high-voltage region U32) that belong to the same phase (U-phase in this case).

SUMMARY OF THE EMBODIMENTS

The summary of the inverter control board (9) described so far is briefly described below.

According to one preferred aspect, an inverter control board (9) that is configured to be connected to an inverter (10) for performing conversion between direct current power and multiple-phase alternating current power and where a drive control circuit for driving and controlling the inverter (10) is formed is as follows: an arm (3A) of the inverter (10) for each alternating-current phase is structured with a series circuit of a high-side switching element (31) connected to a direct-current positive electrode (P) and a low-side switching element (32) connected to a direct-current negative electrode (N); a low-voltage region (A1) and a high-voltage region (A3) are formed on the board as regions where circuits are arranged; the circuit arranged in the high-voltage region (A3) has a higher operating voltage than the circuit arranged in the low-voltage region (A1); the high-voltage region (A3) includes multiple high-side high-voltage regions (A31), each configured to be connected to the high-side switching element (31) of a corresponding phase; the high-voltage region (A3) includes multiple low-side high-voltage regions (A32), each configured to be connected to the low-side switching element (32) of a corresponding phase; an insulation region (A5) is formed on the board and electrically insulates the low-voltage region (A1), each of the high-side high-voltage regions (A31), and each of the low-side high-voltage regions (A32) from one another; the circuit in low-voltage region (A1) is connected to the circuit in each of high-side high-voltage regions (A31) via a high-side connection circuit (51) included in a connection circuit (5) across the insulation region (A5) and that transmits a signal in an electrically insulated state; the circuit in the low-voltage region (A1) is connected to the circuit in each of the low-side high-voltage regions (A32) via a low-side connection circuit (52) included in the connection circuit (5) and that transmits a signal in an electrically insulated state; and a voltage detection circuit (6) for detecting a direct-current-side voltage (Vdc) of the inverter (10) is arranged between the high-side connection circuit (51) and the low-side connection circuit (52) that are adjacent to each other.

The high-side connection circuits (51) and the low-side connection circuits (52) are arranged across the insulation region (A5) to connect the circuit in low-voltage region (A1) and the circuit in the high-voltage region (A3). That is, portions of the high-side connection circuits (51) and the low-side connection circuits (52) are arranged in the low-voltage region (A1), and the other portions thereof are arranged in the high-voltage region (A3). Further, the voltage detection circuit (6) is arranged between the high-side connection circuit (51) and the low-side connection circuit (52) that are adjacent to each other. Thus, a portion of the voltage detection circuit (6) is arranged in the low-voltage region (A1), and the other portion thereof is arranged in the high-voltage region (A3). Also in the voltage detection circuit (6), it may be necessary to insulate a circuit arranged in the low-voltage region (A1) from a circuit arranged in the high-voltage region (A3). In such a case, there is no need to set an additional insulation region (A5), because the insulation region (A5) across which the connection circuits (5) on both sides of the voltage detection circuit (6) are arranged can be utilized. Thus, although the voltage detection circuit (6) is arranged on the inverter control board (9), an increase in the size of the inverter control board (9) can be curbed. That is, according to this structure, the detection circuit (6) for detecting the direct-current-side voltage (Vdc) of the inverter (10) that performs conversion between direct current power and alternating current power can be appropriately arranged on the inverter control board (9).

Preferably, the voltage detection circuit (6) may detect the direct-current-side voltage (Vdc) of the inverter (10) with respect to a reference potential for the low-side high-voltage regions (A32).

A reference potential for the inverter (10) is the negative electrode (N) connected to the low-side switching elements (32), and the reference potential for the low-side high-voltage regions (A32) is the negative electrode (N). Further, the direct-current-side voltage (Vdc) of the inverter (10) is the difference in potential between the positive electrode (P) and the negative electrode (N). Therefore, the voltage detection circuit (6) is capable of properly detecting the direct-current-side voltage (Vdc) of the inverter (10) with respect to the potential of the negative electrode (N) that is the reference potential for the low-side high-voltage regions (A32).

Preferably, the high-side connection circuits (51) and the low-side connection circuits (52) of the multiple phases may be arranged in a line.

According to this structure, the high-side connection circuits (51) and the low-side connection circuits (52) of the multiple phases are efficiently arranged on the inverter control board (9). This facilitates leaving space for the voltage detection circuit (6) arranged between the high-side connection circuit (51) and the low-side connection circuit (52).

Further, when the high-side connection circuits (51) and the low-side connection circuits (52) of the multiple phases are arranged in a line, each of the high-side connection circuits (51) and each of the low-side connection circuits (52) may preferably include at least a drive circuit (2) for transmitting a switching control signal (SW) from the low-voltage region (A1) to the high-voltage region (A3) and a drive power supply (L) for supplying electric power to the drive circuit (2), and the drive circuits (2) and the drive power supplies (L) may preferably be arranged along a direction in which the high-side connection circuits (51) and the low-side connection circuits (52) are arranged.

In many cases, the connection circuits (5) include the drive circuits (2) and the drive power supplies (L). When the drive circuits (2) and the drive power supplies (L) are arranged along the direction in which the high-side connection circuits (51) and the low-side connection circuits (52) are arranged, the drive circuits (2) and the drive power supplies (L) are efficiently arranged on the inverter control board (9). This facilitates leaving space for the voltage detection circuit (6) arranged between the high-side connection circuit (51) and the low-side connection circuit (52).

Further, the inverter control board (9) may preferably be structured as follows: in the high-side high-voltage regions (A31), at least positive-electrode-side connection terminals (T1) connected to collector or drain terminals of the high-side switching elements (31) are arranged; in the low-side high-voltage regions (A32), at least negative-electrode-side connection terminals (T2) connected to emitter or source terminals of the low-side switching elements (32) are arranged; in each of the high-side high-voltage regions (A31), the positive-electrode-side connection terminal (T1) is arranged closer to one of the low-side high-voltage regions (A32) that are adjacent to the high-side high-voltage region (A31) across the insulation region (A5); in each of the low-side high-voltage regions (A32), the negative-electrode-side connection terminal (T2) is arranged closer to one of the high-side high-voltage regions (A31) that are adjacent to the low-side high-voltage region (A32) across the insulation region (A5); and the voltage detection circuit (6) is connected to the positive-electrode-side connection terminal (T1) and the negative-electrode-side connection terminal (T2) that are adjacent to each other across the insulation region (A5).

The collector or drain terminals of the high-side switching elements (31) are connected to the direct-current positive electrode (P) on the direct-current side of the inverter (10). In contrast, the emitter or source terminals of the low-side switching elements (32) are connected to the direct-current negative electrode (N) on the direct-current side of the inverter (10). By providing the positive-electrode-side connection terminals (T1) connected to the collector or drain terminals in the high-side high-voltage regions (A31) that are connected to the high-side switching elements (31), it is possible to connect the direct-current positive electrode (P) to the inverter control board (9). Likewise, by providing the negative-electrode-side connection terminals (T2) connected to the emitter or source terminals in the low-side high-voltage regions (A32) that are connected to the low-side switching elements (32), it is possible to connect the direct-current negative electrode (N) to the inverter control board (9). The voltage detection circuit (6) is arranged between the high-side connection circuit (51) and the low-side connection circuit (52) that are adjacent to each other, and is consequently arranged between the high-side high-voltage region (A31) and the low-side high-voltage region (A32) that are adjacent to each other. That is, according to this structure, the voltage detection circuit (6) is connected to the positive-electrode-side connection terminal (T1) and the negative-electrode-side connection terminal (T2) that are arranged close to each other, and this allows the voltage detection circuit (6) to be connected to the positive electrode (P) and the negative electrode (N) by a relatively short connection path.

Further, it may be preferable that a switching-control-signal generation circuit (1) that generates a switching control signal (SW) for controlling switching of the inverter (10) be arranged in the low-voltage region (A1) and that, of multiple locations between the high-side connection circuits (51) and the low-side connection circuits (52), the voltage detection circuit (6) be arranged at the location closest to the switching-control-signal generation circuit (1).

The switching-control-signal generation circuit (1) generates an appropriate switching control signal (SW) using a detection result from the voltage detection circuit (6). If the detection result from the voltage detection circuit (6) is influenced by noise or the like, the switching control signal (SW) is influenced accordingly. For this reason, a transmission path for transmitting the detection result from the voltage detection circuit (6) to the switching-control-signal generation circuit (1) preferably be short in length. When the voltage detection circuit (6) is arranged close to the switching-control-signal generation circuit (1), the transmission path can be shortened accordingly.

Further, the voltage detection circuit (6) may preferably be arranged between the high-side connection circuit (51) and the low-side connection circuit (52) that belong to the same phase.

The high-side switching element (31) and the low-side switching element (32) that belong to the same phase are commonly arranged close to each other, because they structure one arm (3A) in the inverter (10). Accordingly, in many cases, the high-side high-voltage region (A31) and the low-side high-voltage region (A32) corresponding to the high-side switching element (31) and the low-side switching element (32) that belong to the same phase are provided adjacent to each other. Thus, the voltage detection circuit (6), which is arranged between the high-side high-voltage region (A31) and the low-side high-voltage region (A32), is also efficiently arranged on the inverter control board (9).

Further, it is preferable that the voltage detection circuit (6) include multiple voltage divider resistors (62) connected in series between the direct-current positive electrode (P) and negative electrode (N), and that all the multiple voltage divider resistors (62) are arranged in the low-side high-voltage region (A32).

A reference potential for the inverter (10) is the negative electrode (N) connected to the low-side switching elements (32), and the reference potential for the low-side high-voltage regions (A32) is the negative electrode (N). Further, the direct-current-side voltage (Vdc) of the inverter (10) is the difference in potential between the positive electrode (P) and the negative electrode (N). Therefore, the voltage detection circuit (6) is capable of properly detecting the directcurrent-side voltage (Vdc) of the inverter (10) with respect to the potential of the negative electrode (N) that is the reference potential for the low-side high-voltage regions (A32). In addition, since the low-side high-voltage regions (A32) have a lower voltage than the high-side high-voltage regions (A31), there is a tendency that the low-side high-voltage regions (A32) allow a shorter insulation distance to other circuits than high-side high-voltage regions (A31). Thus, the low-side high-voltage regions (A32) are more likely to have room for mounting parts than the high-side high-voltage regions (A31). Therefore, when all the multiple voltage divider resistors (62) are arranged in the low-side high-voltage region (A32), the voltage detection circuit (6) can be appropriately arranged on the inverter control board (9).

The invention claimed is:

1. An inverter control board that is configured to be connected to an inverter for performing conversion between direct current power and multiple-phase alternating current power, wherein the inverter has arms, each arm provided for one alternating current phase and comprising a series circuit of a high-side switching element to be connected to a direct-current positive electrode and a low-side switching element to be connected to a direct-current negative electrode, the inverter control board comprising:
   a drive control circuit for driving and controlling the inverter;
   a low-voltage region and a high-voltage region as regions where a plurality of circuits are arranged, wherein:
      a circuit of the plurality of circuits arranged in the high-voltage region has a higher operating voltage than a circuit of the plurality of circuits arranged in the low-voltage region,
      the high-voltage region includes a plurality of high-side high-voltage regions, each configured to be connected to the high-side switching element of a corresponding phase, and
      the high-voltage region includes a plurality of low-side high-voltage regions, each configured to be connected to the low-side switching element of a corresponding phase;
   an insulation region that electrically insulates the low-voltage region, each of the high-side high-voltage regions, and each of the low-side high-voltage regions from one another, wherein:
      the circuit in the low-voltage region and the circuit in each of the high-side high-voltage regions are connected via respective high-side connection circuits included in a connection circuit across the insulation region and that transmits a signal in an electrically insulated state, and
      the circuit in the low-voltage region and the circuit in each of the low-side high-voltage regions are connected via respective low-side connection circuits included in the connection circuit and that transmits a signal in an electrically insulated state; and
   a voltage detection circuit for detecting a direct-current-side voltage of the inverter is arranged between the high-side connection circuit and the low-side connection circuit that are adjacent to each other.

2. The inverter control board according to claim 1, wherein
   the voltage detection circuit detects the direct-current-side voltage of the inverter with respect to a reference potential for the low-side high-voltage regions.

3. The inverter control board according to claim 2, wherein
   the high-side connection circuits and the low-side connection circuits of the multiple phases are arranged in a line.

4. The inverter control board according to claim 3, wherein
   each of the high-side connection circuits and each of the low-side connection circuits includes at least a drive circuit for transmitting a switching control signal from the low-voltage region to the high-voltage region and a drive power supply for supplying electric power to the drive circuit, and
   the drive circuits and the drive power supplies are arranged along a direction in which the high-side connection circuits and the low-side connection circuits are arranged.

5. The inverter control board according to claim 4, wherein
   in the high-side high-voltage regions, at least positive-electrode-side connection terminals to be connected to collector or drain terminals of the high-side switching elements are arranged,
   in the low-side high-voltage regions, at least negative-electrode-side connection terminals to be connected to emitter or source terminals of the low-side switching elements are arranged,
   in each of the high-side high-voltage regions, the positive-electrode-side connection terminal is arranged closer to one of the low-side high-voltage regions that are adjacent to the high-side high-voltage region across the insulation region,
   in each of the low-side high-voltage regions, the negative-electrode-side connection terminal is arranged closer to one of the high-side high-voltage regions that are adjacent to the low-side high-voltage region across the insulation region, and
   the voltage detection circuit is connected to the positive-electrode-side connection terminal and the negative-electrode-side connection terminal that are located adjacent to each other across the insulation region.

6. The inverter control board according to claim 5, wherein
   a switching-control-signal generation circuit that generates a switching control signal for controlling switching of the inverter is arranged in the low-voltage region, and
   of a plurality of locations between the high-side connection circuits and the low-side connection circuits, the voltage detection circuit is arranged at a location closest to the switching-control-signal generation circuit.

7. The inverter control board according to claim 6, wherein
   the voltage detection circuit is arranged between the high-side connection circuit and the low-side connection circuit that belong to the same phase.

8. The inverter control board according to claim 7, wherein
   the voltage detection circuit includes a plurality of voltage divider resistors connected in series between the direct-current positive electrode and the direct-current negative electrode, and
   all the plurality of voltage divider resistors are arranged in the low-side high-voltage region.

9. The inverter control board according to claim 2, wherein
   in the high-side high-voltage regions, at least positive-electrode-side connection terminals to be connected to collector or drain terminals of the high-side switching elements are arranged,
   in the low-side high-voltage regions, at least negative-electrode-side connection terminals to be connected to emitter or source terminals of the low-side switching elements are arranged,
   in each of the high-side high-voltage regions, the positive-electrode-side connection terminal is arranged closer to one of the low-side high-voltage regions that are adjacent to the high-side high-voltage region across the insulation region,
   in each of the low-side high-voltage regions, the negative-electrode-side connection terminal is arranged closer to one of the high-side high-voltage regions that are adjacent to the low-side high-voltage region across the insulation region, and
   the voltage detection circuit is connected to the positive-electrode-side connection terminal and the negative-electrode-side connection terminal that are located adjacent to each other across the insulation region.

10. The inverter control board according to claim 2, wherein
    a switching-control-signal generation circuit that generates a switching control signal for controlling switching of the inverter is arranged in the low-voltage region, and
    of a plurality of locations between the high-side connection circuits and the low-side connection circuits, the voltage detection circuit is arranged at a location closest to the switching-control-signal generation circuit.

11. The inverter control board according to claim 2, wherein
    the voltage detection circuit is arranged between the high-side connection circuit and the low-side connection circuit that belong to the same phase.

12. The inverter control board according to claim 2, wherein
    the voltage detection circuit includes a plurality of voltage divider resistors connected in series between the direct-current positive electrode and the direct-current negative electrode, and
    all the plurality of voltage divider resistors are arranged in the low-side high-voltage region.

13. The inverter control board according to claim 1, wherein
    the high-side connection circuits and the low-side connection circuits of each alternating current phase are arranged in a line.

14. The inverter control board according to claim 13, wherein
    each of the high-side connection circuits and each of the low-side connection circuits includes at least a drive circuit for transmitting a switching control signal from the low-voltage region to the high-voltage region and a drive power supply for supplying electric power to the drive circuit, and
    the drive circuits and the drive power supplies are arranged along a direction in which the high-side connection circuits and the low-side connection circuits are arranged.

15. The inverter control board according to claim 13, wherein
    in the high-side high-voltage regions, at least positive-electrode-side connection terminals to be connected to collector or drain terminals of the high-side switching elements are arranged,
    in the low-side high-voltage regions, at least negative-electrode-side connection terminals to be connected to emitter or source terminals of the low-side switching elements are arranged,
    in each of the high-side high-voltage regions, the positive-electrode-side connection terminal is arranged closer to one of the low-side high-voltage regions that are adjacent to the high-side high-voltage region across the insulation region,
    in each of the low-side high-voltage regions, the negative-electrode-side connection terminal is arranged closer to one of the high-side high-voltage regions that are adjacent to the low-side high-voltage region across the insulation region, and
    the voltage detection circuit is connected to the positive-electrode-side connection terminal and the negative-electrode-side connection terminal that are located adjacent to each other across the insulation region.

16. The inverter control board according to claim 13, wherein
    a switching-control-signal generation circuit that generates a switching control signal for controlling switching of the inverter is arranged in the low-voltage region, and
    of a plurality of locations between the high-side connection circuits and the low-side connection circuits, the voltage detection circuit is arranged at a location closest to the switching-control-signal generation circuit.

17. The inverter control board according to claim 1, wherein
    in the high-side high-voltage regions, at least positive-electrode-side connection terminals to be connected to collector or drain terminals of the high-side switching elements are arranged,
    in the low-side high-voltage regions, at least negative-electrode-side connection terminals to be connected to emitter or source terminals of the low-side switching elements are arranged,
    in each of the high-side high-voltage regions, the positive-electrode-side connection terminal is arranged closer to one of the low-side high-voltage regions that are adjacent to the high-side high-voltage region across the insulation region,
    in each of the low-side high-voltage regions, the negative-electrode-side connection terminal is arranged closer to one of the high-side high-voltage regions that are adjacent to the low-side high-voltage region across the insulation region, and
    the voltage detection circuit is connected to the positive-electrode-side connection terminal and the negative-electrode-side connection terminal that are located adjacent to each other across the insulation region.

18. The inverter control board according to claim 1, wherein
    a switching-control-signal generation circuit that generates a switching control signal for controlling switching of the inverter is arranged in the low-voltage region, and
    of a plurality of locations between the high-side connection circuits and the low-side connection circuits, the voltage detection circuit is arranged at a location closest to the switching-control-signal generation circuit.

19. The inverter control board according to claim 1, wherein
the voltage detection circuit is arranged between the high-side connection circuit and the low-side connection circuit that belong to the same phase.

20. The inverter control board according to claim 1, wherein
the voltage detection circuit includes a plurality of voltage divider resistors connected in series between the direct-current positive electrode and the direct-current negative electrode, and
all the plurality of voltage divider resistors are arranged in the low-side high-voltage region.

* * * * *